United States Patent [19]
Bucci et al.

[11] Patent Number: 5,939,775
[45] Date of Patent: *Aug. 17, 1999

[54] LEADFRAME STRUCTURE AND PROCESS FOR PACKAGING INTERGRATED CIRCUITS

[75] Inventors: Giuseppe D. Bucci, Monte Sereno; Paul H. Voisin, San Mateo, both of Calif.

[73] Assignee: GCB Technologies, LLC, Saratoga, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/744,520

[22] Filed: Nov. 5, 1996

[51] Int. Cl.⁶ .................................................. H01L 23/495
[52] U.S. Cl. ........................ 257/667; 257/671; 438/127
[58] Field of Search .................................. 257/666, 667, 257/670, 671, 695; 438/124, 127

[56] References Cited

U.S. PATENT DOCUMENTS

| | | | |
|---|---|---|---|
| 3,778,887 | 12/1973 | Suzuki et al. | 29/588 |
| 4,204,317 | 5/1980 | Winn | 29/827 |
| 4,707,724 | 11/1987 | Suzuki et al. | 357/71 |
| 4,721,994 | 1/1988 | Mine et al. | 357/70 |
| 4,754,317 | 6/1988 | Comstock et al. | 357/70 |
| 4,774,635 | 9/1988 | Greenberg et al. | 361/421 |
| 4,778,146 | 10/1988 | Olla et al. | 249/85 |
| 4,796,080 | 1/1989 | Phy | 357/70 |
| 4,801,997 | 1/1989 | Ono et al. | 357/70 |
| 4,883,774 | 11/1989 | Djennas et al. | 437/211 |
| 4,890,157 | 12/1989 | Wilson | 357/80 |
| 4,899,207 | 2/1990 | Hallowell et al. | 357/70 |
| 4,903,401 | 2/1990 | Webb | 29/827 |
| 4,977,442 | 12/1990 | Suzuki et al. | 357/70 |
| 5,122,858 | 6/1992 | Mahulikar et al. | 357/70 |
| 5,147,210 | 9/1992 | Patterson et al. | 439/91 |
| 5,177,591 | 1/1993 | Emanuel | 257/674 |
| 5,185,653 | 2/1993 | Switky et al. | 257/729 |
| 5,202,577 | 4/1993 | Ichigi et al. | 257/667 |
| 5,208,481 | 5/1993 | Kurita et al. | 257/666 |
| 5,213,748 | 5/1993 | Biswas et al. | 264/251 |
| 5,221,812 | 6/1993 | Long | 174/52.4 |
| 5,223,738 | 6/1993 | Okada | 257/666 |
| 5,225,897 | 7/1993 | Reifel et al. | 257/787 |
| 5,231,755 | 8/1993 | Emanuel | 29/827 |
| 5,239,131 | 8/1993 | Hoffman et al. | 174/52.4 |
| 5,245,214 | 9/1993 | Simpson | 257/666 |
| 5,270,262 | 12/1993 | Switky et al. | 437/217 |
| 5,271,148 | 12/1993 | Desrochers et al. | 29/827 |
| 5,285,104 | 2/1994 | Kondo et al. | 257/666 |
| 5,286,999 | 2/1994 | Chiu | 257/666 |
| 5,294,828 | 3/1994 | Okumura | 257/676 |
| 5,304,738 | 4/1994 | Long | 174/52.4 |
| 5,309,027 | 5/1994 | Letterman, Jr. | 257/796 |
| 5,309,322 | 5/1994 | Wagner et al. | 361/723 |

(List continued on next page.)

FOREIGN PATENT DOCUMENTS

| | | | |
|---|---|---|---|
| 0434195 | 6/1991 | European Pat. Off. | 257/667 |
| 2-310955 | 12/1990 | Japan | 257/667 |
| 4-091464 | 3/1992 | Japan | 257/667 |
| 4317346 | 11/1992 | Japan . | |
| 5-021695 | 1/1993 | Japan | 257/667 |
| 5-152487 | 6/1993 | Japan | 257/667 |
| 5-243478 | 9/1993 | Japan | 257/667 |
| 6132466 | 5/1994 | Japan . | |

Primary Examiner—David B. Hardy
Attorney, Agent, or Firm—Townsend and Townsend and Crew LLP

[57] ABSTRACT

An improved leadframe structure and an improved IC package and process using such structure are disclosed. The improved leadframe structure eliminates the dambar commonly found on leadframes for use in plastic packages. A polymer structure is formed and employed primarily to act as a barrier to flashing during the epoxy encapsulation process and secondarily to provide support for the leads. The polymer structure remains a permanent part of the IC package following molding. An improved IC packaging process using the improved leadframe design eliminates common debar, dejunk and deflash operations, resulting in reduced capital costs and higher yields.

31 Claims, 18 Drawing Sheets

U.S. PATENT DOCUMENTS

| | | | |
|---|---|---|---|
| 5,313,102 | 5/1994 | Lim et al. | 257/787 |
| 5,328,552 | 7/1994 | Benzoni | 156/630 |
| 5,329,159 | 7/1994 | Lin | 257/666 |
| 5,336,272 | 8/1994 | Tsutsumi et al. | 29/25.01 |
| 5,338,899 | 8/1994 | Gainey | 174/52.4 |
| 5,339,518 | 8/1994 | Tran | 29/827 |
| 5,340,771 | 8/1994 | Rostoker | 437/209 |
| 5,343,072 | 8/1994 | Imai et al. | 257/666 |
| 5,354,422 | 10/1994 | Kato et al. | 156/664 |
| 5,355,018 | 10/1994 | Fierken | 257/669 |
| 5,359,225 | 10/1994 | Haley | 257/671 |
| 5,367,191 | 11/1994 | Ebihara | 257/666 |
| 5,378,656 | 1/1995 | Kajihara et al. | 437/217 |
| 5,378,657 | 1/1995 | Lin | 437/217 |
| 5,384,286 | 1/1995 | Hirai | 437/207 |
| 5,389,577 | 2/1995 | McClure | 437/206 |
| 5,391,439 | 2/1995 | Tomita et al. | 428/571 |
| 5,403,784 | 4/1995 | Hashemi et al. | 437/217 |
| 5,403,785 | 4/1995 | Arai et al. | 437/220 |
| 5,437,915 | 8/1995 | Nishimura et al. | 428/209 |
| 5,438,021 | 8/1995 | Tagawa et al. | 437/207 |
| 5,445,995 | 8/1995 | Casati et al. | 437/211 |
| 5,451,812 | 9/1995 | Gomi | 257/666 |
| 5,455,745 | 10/1995 | Weiler et al. | 361/813 |
| 5,457,341 | 10/1995 | West | 257/667 |
| 5,466,968 | 11/1995 | Okumura et al. | 257/693 |
| 5,471,097 | 11/1995 | Shibata | 257/666 |
| 5,479,050 | 12/1995 | Pritchard et al. | 257/670 |
| 5,486,722 | 1/1996 | Sato et al. | 257/667 |
| 5,541,447 | 7/1996 | Maejima et al. | 257/669 |
| 5,559,364 | 9/1996 | Hojyo | 257/666 |
| 5,637,914 | 6/1997 | Tanaka et al. | 257/666 |
| 5,659,198 | 8/1997 | Okutomo et al. | 257/659 |

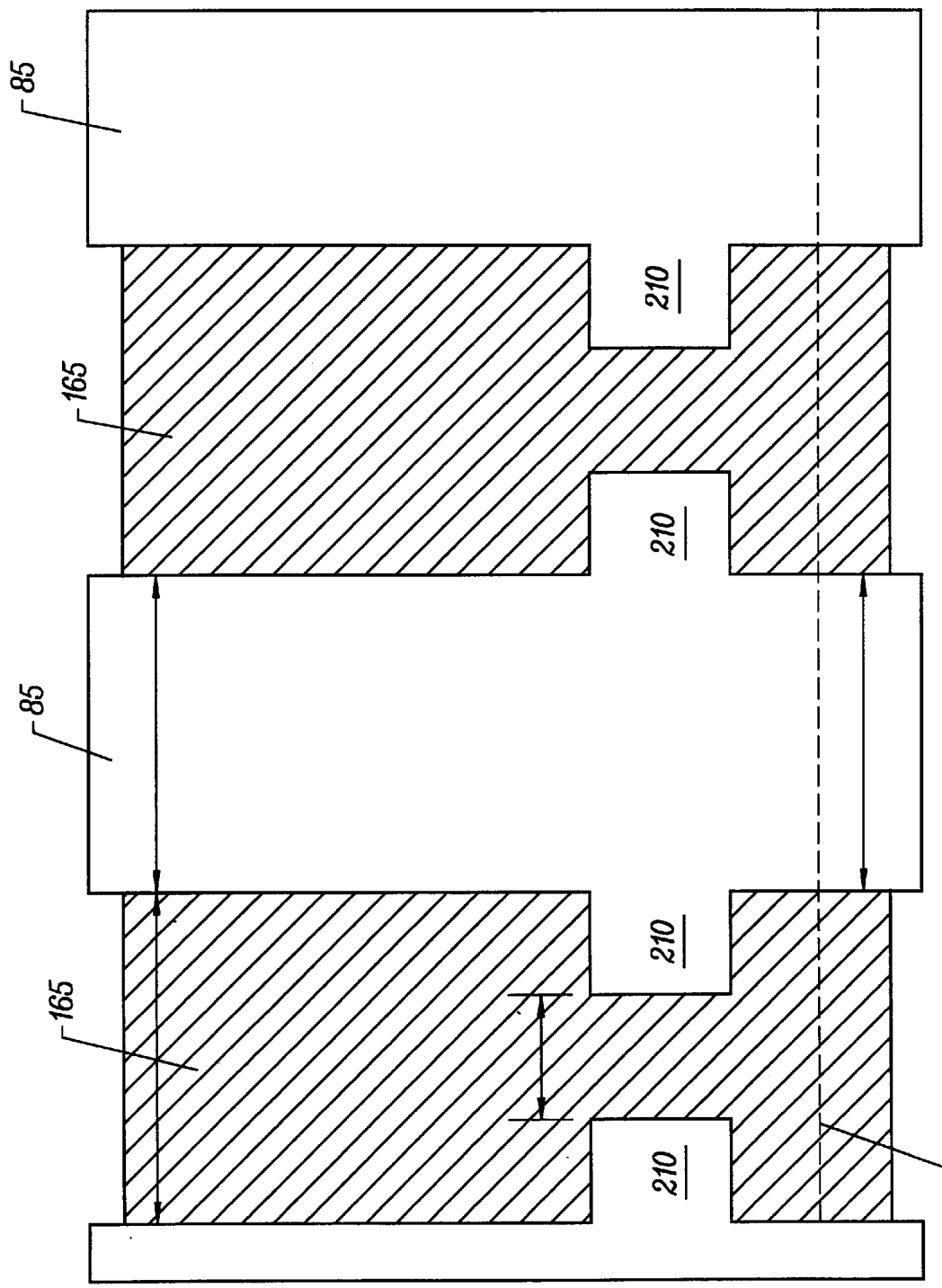

LEADFRAME STRUCTURE AND PROCESS FOR PACKAGING INTERGRATED CIRCUITS

BACKGROUND OF THE INVENTION

1. Field of the Invention

The present invention relates generally to the packaging of semiconductor integrated circuits and more particularly to "leadframes" that provide electrical connection between a packaged integrated circuit and the external environment.

2. Background and Related Art

Semiconductor integrated circuits (ICs) are often housed or encapsulated in plastic packages in order to protect them from damage or contamination. Typically, a packaged IC includes a number of electrically conductive leads which provide a means of electrical connection between the encapsulated IC and the external environment. The IC packaging, including the leads, also facilitates the placement and attachment of the IC on printed circuit boards (PCBs), also known as printed wiring boards (PWBs).

Current IC packaging or "assembly" processes typically include some or all of the following steps:

1. Form leadframe
2. Attach IC die to leadframe bonding pad
3. Locate leads
4. Bond connection wires to IC and leads
5. Encapsulate in plastic epoxy (mold)
6. Debar and dejunk
7. Deflash
8. Plate Outer leads
9. Trim/Form
10. Rework (if necessary)

While actual packaging processes often include other steps and substeps, brief consideration of the foregoing steps is sufficient to illustrate certain significant drawbacks and shortcomings of the current processes.

A significant number of the assembly steps, and particularly those concerned with the formation and connection of the leads, require expensive equipment, tooling, materials, personnel, space and utilities. In fact, current packaging processes may often account for as much of the cost of the finished product as the IC itself. In current high leadcount IC packages, such as a 208 pin quad flat pack (QFP), the lead related steps alone typically account for 20–25% of the total packaging cost.

Further, while some of the materials and designs of the subcomponents used in the packaging process represent true value additions relative to circuit functionality, protection and performance, others serve principally as process aids which are either incorporated in the package or which must subsequently be dealt with or removed at considerable additional expense and with attendant reductions in yield. A significant example is the dambar structure typically used in current leadframe designs primarily to facilitate the plastic molding or encapsulation process and secondarily to provide additional support for the leads. During the encapsulation process, the dambar is supposed to function as a clamping surface for the edges of the mold and as a barrier to prevent leakage or "flashing" of the epoxy from the mold onto the leads. Unfortunately, however, even with the high clampdown forces typically used, a completely uniform seal is not always formed between the dambar and the edges of the mold. One reason is that several strips of leadframes are typically processed simultaneously in each molding operation. Variations between strips can cause discontinuities in the seal between the gasket and the mold edges. Additionally, epoxy particulates can build up or be deposited on the mold clampdown surfaces and prevent formation of a complete seal. It is thus not at all uncommon for epoxy to "streak" out from the mold cavity in those regions where the seal is incomplete, resulting in "flashing" on the outer leads.

Following encapsulation, not only must the dambar be removed to physically and electrically individualize the leads, but in addition the "flashing" must be removed prior to subsequent plating of the leads, to assure complete and uniform coverage of the plating material. Accordingly, additional "debar" and "dejunk," or alternatively dambar removal and "deflash," are required. It is a significant drawback of current leadframe designs and of the packaging processes that use such designs that the debar, dejunk and deflash operations (1) are required at all, (2) are relatively expensive, (3) are time consuming and (4) adversely effect yield.

For example, the dambar is typically removed mechanically using a fairly high tonnage punch press. Typically, for higher lead count packages, a two stage tooling assembly is used. For a 208 lead package, for example, the tool will have 208 punches. However for certain configuration having dual dambars and inner and outer leads, such as a molded carrier ring (MCR) configuration, twice as many punches are required. For example, for a 208 lead MCR package, the tool will have 416 punches. In the first stage, half the punches excise the portions of the dambar(s) between every second lead. In the second stage, the remaining punches excise the remaining portions of the dambar(s).

The typical cost for tooling today to debar a 208 I/O leadframe with a pitch of $\geq 0.025$ inch is approximately $100,000. For a 208 lead MCR package, the cost of tooling is significantly higher. As the outer lead pitch is decreased to 0.020 inch or less, the cost of tooling increases still more dramatically.

In addition, during the debar operation, epoxy trapped in the dam can easily crack and shatter. Fissures are thus created within which solder may deposit between the leads during subsequent plating operations. This can lead to shorting of the leads or at least compromise in electrical performance. Moreover, stray pieces of epoxy can become lodged on the punches causing damage and/or requiring reworking of the tooling. Including reworks, the typical punch usually has a useful "life" of approximately 750,000 "hits." Obviously, in order to maintain continuous operation a second tool is required while one is being reworked or otherwise serviced. The requirement for a second tool means additional capital investment attributable to the dambar removal process. Additionally it is both time consuming and expensive to rework the punch tools. Moreover, as the space between leads (pitch) changes with different leadframe designs, new tooling and hence a further investment of capital are required.

In addition to the direct costs associated with tooling, the typical debar process can result in yield losses due to offsets between the tools and the leads. Such offsets result in the unintended removal of material from the leads as well as the dambar, which may unacceptably weaken or even sever a lead. Such offsets arise from variations in the tooling (locating) holes on the leadframe as well as from tooling misalignments, for example. Losses at this nearly final stage of the semiconductor manufacturing process are particularly expensive. Even offsets that do not result in immediate rejection during the debar/dejunk operation may give rise to lead skewing and/or deviation from co-planarity of the outer leads in the subsequent trim/form operation. Parts that exhibit these problems have to be reworked manually so that they will properly fit on a PCB during any subsequent attachment operation, for example a solder reflow operation. Obviously such manual rework is both time consuming and expensive as well.

The debar operation can also adversely impact subsequent steps of the packaging process, for example the plating and trim/form operations. In the trim/form operation, for example, the outer portions of the leads are trimmed and the leads formed into the familiar "gull wing" configuration. The cutting of the dambar can result in rough edges in certain areas on the leads. During the plating process, the areas containing these rough edges tend to draw more current, and hence to accumulate more plating material, often in the form of "balls" or nodules. These nodules can transfer onto the tooling used in the trim/form operation and wear and contaminate the tooling, which in turn require more frequent cleaning and maintenance.

Following the debar operation, a "deflash" operation is required to remove any epoxy that may have "flashed" onto the outer leads during the encapsulation operation. The deflash operation also serves to remove any debris generated during the debar operation. Although the deflash operation generally does not result in significant yield losses per se, it does exhibit some very undesirable side effects. For example, the media (slurry or dry) or the chemical used to deflash may have the undesired side effect of destroying the "skin" of the molded package while removing the unwanted "flash" from the leads. The "skin" normally functions as a pseudo- "moisture barrier" to a substructure that is quite porous. The removal of the skin therefore exposes the substructure and renders it more susceptible to chemical ingress during the various chemical treatments of the subsequent plating process. In addition, the deflash operation, whether "media" or chemical, requires the disposal of used media/plastic and/or solvents. Of course, in addition to the disposal costs, there is a cost for the "media" and/or the solvents themselves. In the case of solvents, there are also in-plant costs for containment and significant safety concerns.

From the foregoing it can be seen that there is a significant need for improvements in the structure of leadframes and the IC packaging operations associated therewith in order to reduce costs, improve yields, improve throughput and eliminate various technical disadvantages. Eliminating some or all of the dambar related operations would significantly reduce the capital investment, the operating costs of packaging ICs, eliminate yield losses associated with these process steps and decrease production time.

Hence, it is an object of the present invention to provide an improved leadframe structure which overcomes the various drawbacks and disadvantages of known leadframe structures and the attendant drawbacks and disadvantages of conventional IC packaging processes that use such leadframes.

It is another object of the present invention to provide an improved leadframe structure which will significantly reduce the size of the IC assembly operation, reduce capital and operating costs and improve manufacturing yields.

It is a further object of the invention to provide an improved leadframe structure which eliminates the dambar structure of known leadframe designs.

It is a still further object of the invention to provide an improved leadframe design which reduces or eliminates flashing during the epoxy molding process and which reduces or eliminates the need for conventional debar, dejunk and deflash operations in the packaging of ICs.

It is a still further object of the invention to provide an improved leadframe design which facilitates the manufacturing of very fine outer lead pitch leadframes without requiring a lateral decrease in lead width, as is often associated with photochemical (etching) manufacturing processes.

SUMMARY OF THE INVENTION

One aspect of the present invention is an improved leadframe structure and method for manufacturing the same. The improved leadframe structure has a frame, a pad adapted to mount an integrated circuit chip and a plurality of leads, with inner ends adjacent the pad and outer ends adjacent the frame. The improved leadframe is provided with a polymer structure between at least some of the leads and intermediate the inner and outer ends thereof. The polymer structure provides a barrier during the IC encapsulation process to prevent flashing of epoxy onto the outer ends of the leads and secondarily provides support for the leads.

Another aspect of the invention is an improved IC package and packaging process using the improved leadframe structure. The improved IC package includes a leadframe structure having a pad, a plurality of leads having inner ends and outer ends with the inner ends adjacent to the pad, and a polymer structure between at least some of the leads intermediate the inner and outer ends. An IC is mounted on the pad and electrical conductors connect the IC and the leadframe. An epoxy package structure encapsulates the IC, the electrical conductors and the inner ends of the leads. The outer ends of the leads extend outside the epoxy structure. During the encapsulation process, the polymer structure acts as a barrier to prevent epoxy material from escaping the mold and flashing onto the outer leads. Following the encapsulation process, the polymer structure is a permanent part of the IC package, which eliminates the need for process steps relating to dambar removal and deflashing.

BRIEF DESCRIPTION OF THE DRAWINGS

FIGS. 14a–14d are graphical plan views of several leads of a presently preferred dambarless leadframe with polymeric structure illustrating several variations of interlocking lead protrusions and notches.

DESCRIPTION OF THE PREFERRED EMBODIMENT

A presently preferred embodiment of an improved leadframe structure according to the invention may be manufactured using known stamping or etching methods or any other suitable method. The invention is not limited with respect to the manner in which the leadframe is formed. Any suitable material may be used for the leadframe, including such known materials as various copper or nickel alloys. Applicability of the invention is not limited by the specific material used for the leadframe.

In addition, the leadframe may be formed in essentially any configuration, including presently known quadflat pack (QFP), molded carrier ring (MCR), small outline (SO), chip carrier (CC), or dual in line package (DIP) configurations. Applicability of the invention is not limited by the configuration, lead count, or lead pitch of the leadframe.

Figure 1:
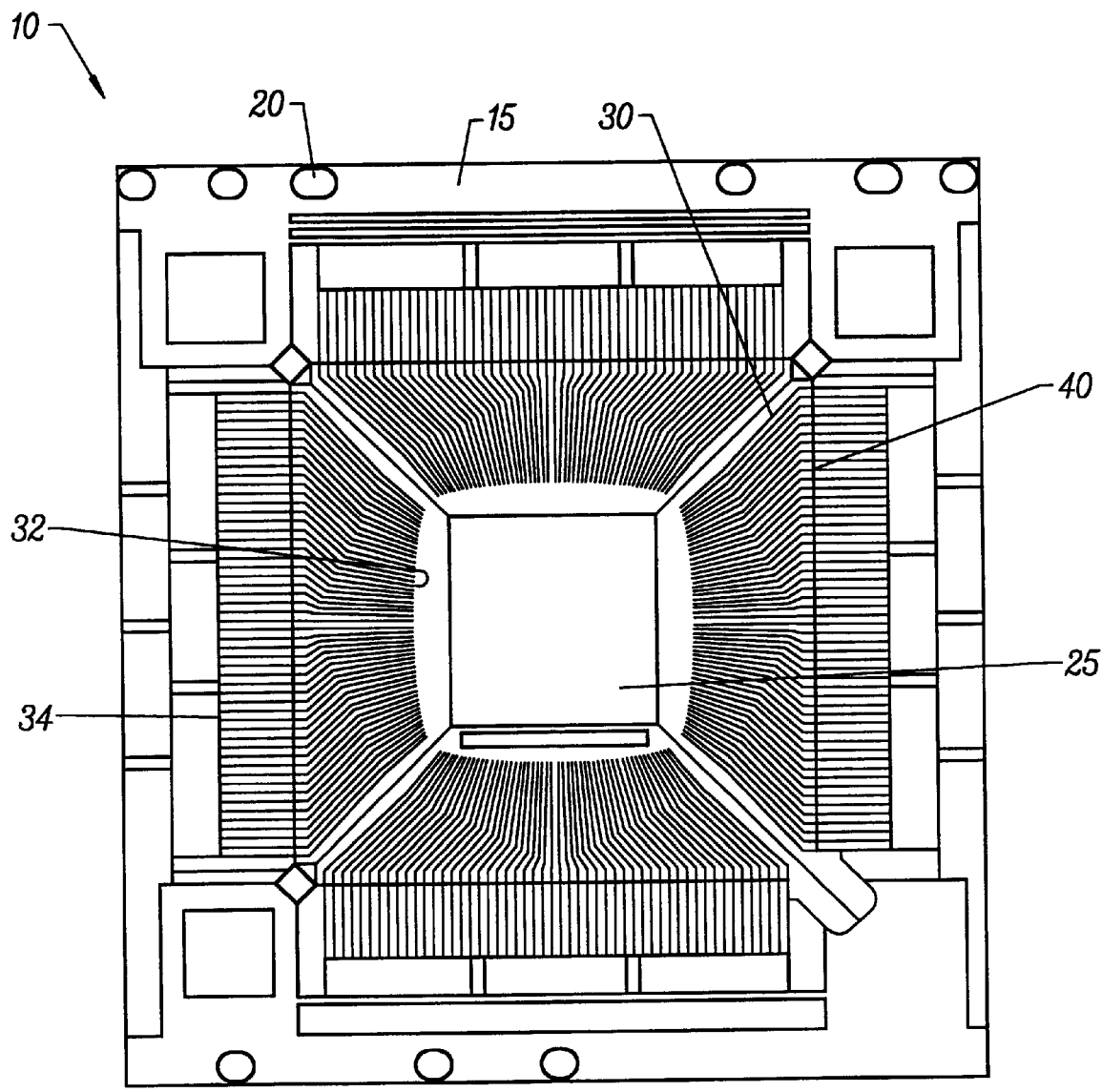
FIG. 1 is a plan view of a known 208 pin leadframe structure for a plastic quad flat pack (QFP) IC package.

An example of a typical leadframe in a QFP configuration is shown in FIG. 1. As shown, the leadframe 10 typically includes an outer frame 15. Many hundreds or thousands of leadframes may be formed from a common strip of material according to known methods, and the outer frame 15 will be common to all leadframes in the same strip, until the individual leadframes are separated. The outer frame 15 typically includes one or more placement and location openings 20. All of the functional elements of the leadframe are precisely located relative to these openings 20 to facilitate the precise positioning of the elements during formation of the leadframe and during the IC assembly process. The leadframe also includes a pad or paddle 25, on which an IC chip will be mounted, and a plurality of leads 30, in this case 208 of them.

Each lead 30 has an inner free end 32 adjacent to the pad 25 and an outer end 34. The inner free ends provide points for electrical connection to the IC, once it is mounted on the pad. The inner free ends 32 of the leads are typically encapsulated along with the IC. The outer ends 34 typically extend outside the IC package to provide a point of electrical connection with external electrical components and circuits.

Figure 2:
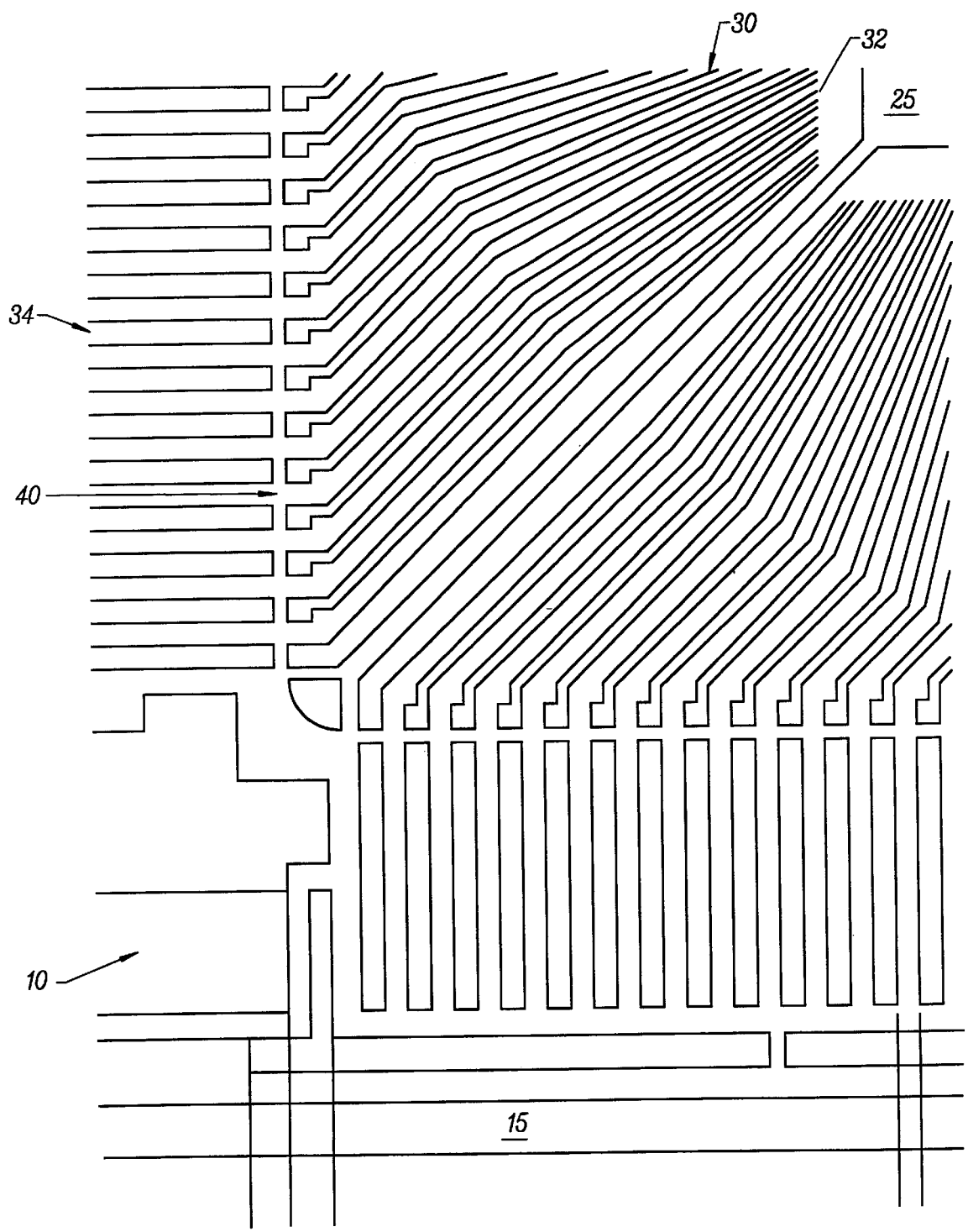
FIG. 2 is a expanded plan view of a portion of a typical leadframe structure, such as shown in FIG. 1, showing the dambar structure and interconnection of the leads.

Referring to FIGS. 1 and 2, in current leadframe designs, a "dambar" structure 40 is typically provided, which interconnects the leads at a point intermediate their inner and outer ends. The primary purpose of the dambar 40 is to serve as a barrier during the molding or encapsulation process to prevent epoxy from escaping the mold and "flashing" onto the outer leads. Secondarily, the dambar provides support for the leads to assist in maintaining the relative positions of the leads during the IC assembly process.

In certain high input/output (I/O) or high leadcount leadframe configurations, such as the MCR, a second dambar may be included to further support the leads to allow an IC device to be transported in a molded carrier ring without the leads being trimmed or formed to final shape and location. This intermediate stage allows for testability prior to the "forming" of the leads to the typical "gull wing" configuration for the attachment on the surface of the printed circuit board. For example, the outer leads may be connected to the inside portion of the second dambar and test leads attached from the opposite direction to the outside portion. The outer ends of the test leads are supported and held in place in a plastic ring, which encompasses the entire leadframe and IC assembly. This design thus allows for testability without damaging the outer leads prior to forming them to the desired configuration prior to attachment on a PCB. The present invention is applicable to such multi-dambar configurations.

In addition to the dambar structure, in some current leadframe designs, a thin strip of stabilizing tape (not shown) may be applied to one side of the inner portion of the leads to provide further positional stability to the leads. Kapton is a suitable tape for this purpose. The present invention may be used with or without such tape depending on the particular leadframe configuration and the needs of the particular packaging process.

After a leadframe is formed, an IC is mounted to the leadframe pad 25 using an electrically conductive adhesive compound, such as a silver containing compound. Many suitable compounds and mounting processes are well known in the art.

Once the IC is mounted, automated equipment is used to visually locate the leads 34 and to electrically interconnect bonding sites on the IC with the inner ends 32 of the leads 34 using a fine, electrically-conductive bonding wire. The wire is typically gold, copper, aluminum or another suitable, electrically conductive material. The locating and bonding equipment, as well as the processes employed are well known in the art and a detailed description is not necessary for a complete understanding of the present invention.

Figure 3:
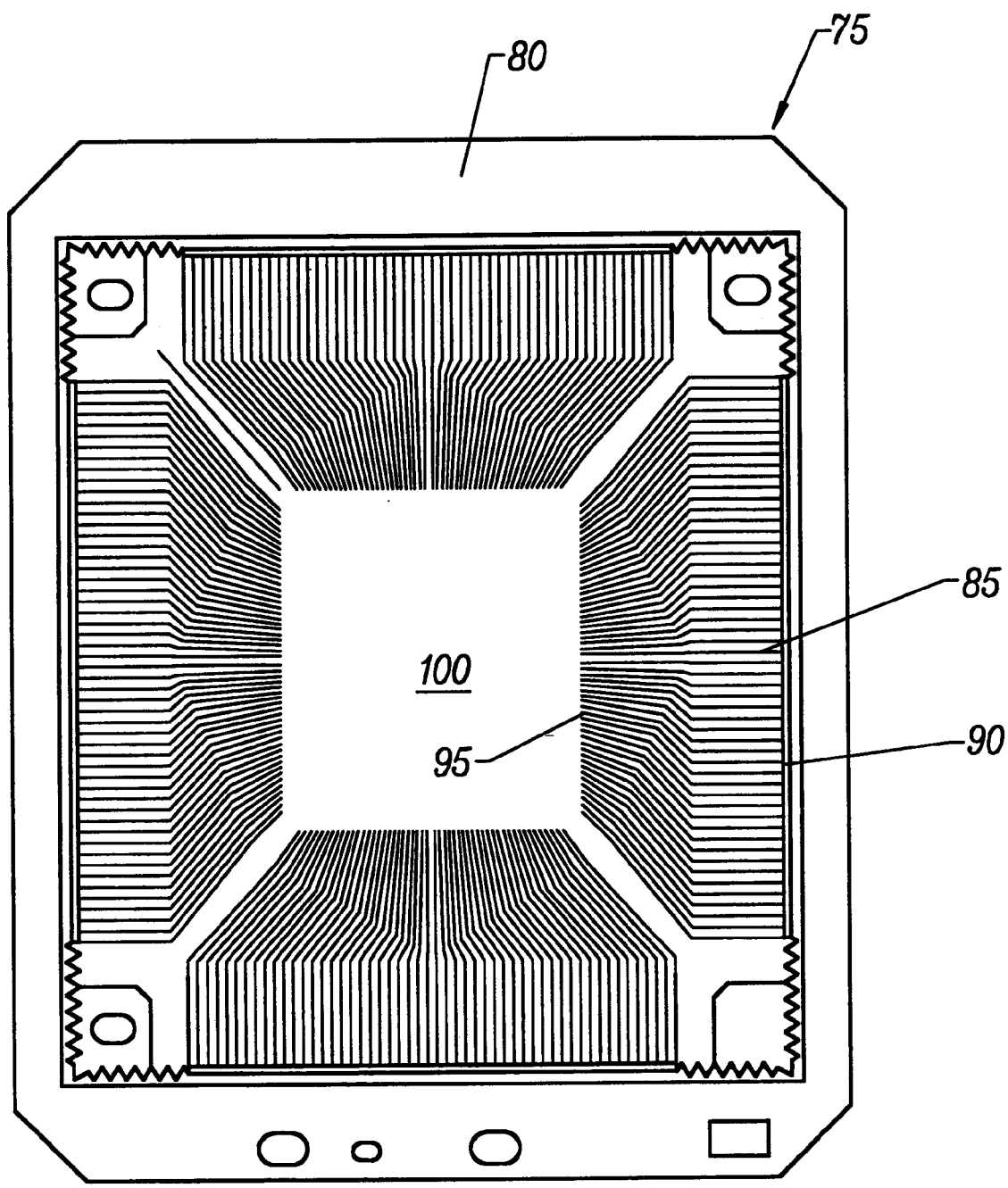
FIG. 3 is a plan view of a presently preferred embodiment of a dambarless leadframe.

Referring to FIG. 3, a presently preferred embodiment of an improved leadframe structure according to the invention is shown. The particular leadframe 75 shown is formed in a QFP configuration. It is similar in structure to conventional QFP leadframes in that it includes an outer frame 80, a pad 100 and a plurality of leads 85 with their outer ends 90 connected to the frame and their inner ends 95 free adjacent to the pad. A major difference, however, is that the improved leadframe according to the invention is preferably formed with no dambar structure.

Figure 4:
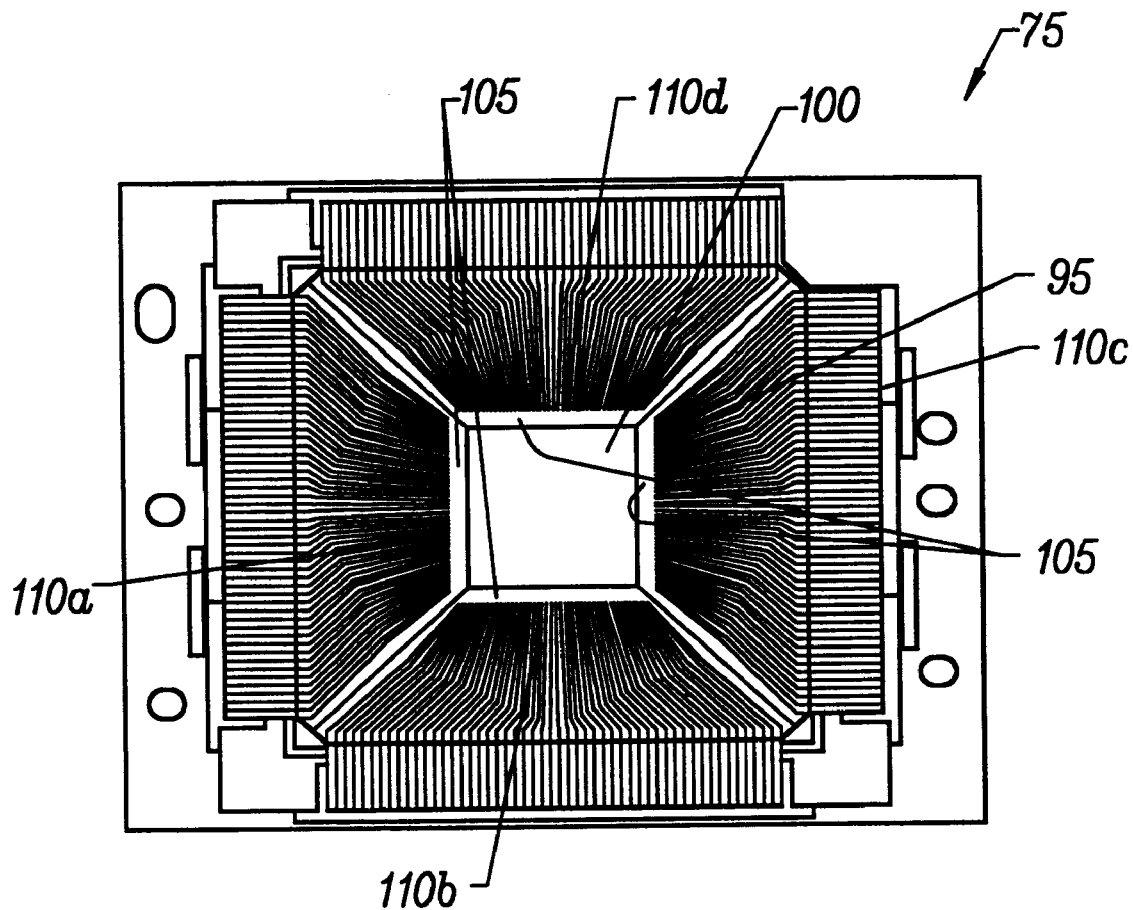
FIG. 4 is a plan view of a presently preferred embodiment of a dambarless leadframe with a connecting bar structure interconnecting the inner ends of the leads.

Alternatively, as shown in FIG. 4, the leadframe 75 may be provided with one or more interconnection bars 105, which interconnect the inner ends 95 of some or all of the leads adjacent the pad 100. In the particular leadframe shown, for example, the leads in each quadrant 110a–d are interconnected, but leadframes are not interconnected across quadrants. Interconnection across quadrants could of course be easily accomplished, if desired, simply by altering the stamping tool or the etching mask used to form the leadframe. This alternative structure is desirable in some configurations, such as the MCR configuration, where the distance from tip to rail of the leads may be particularly long, and the leads may be particularly fragile and easily damaged during the packaging process. In such configurations the interconnection bars 105 provide additional support for the leads. The interconnection bars 105 may be removed during the packaging process at the same time as the pad downset operation. The tooling for this operation, typically a two stage punch operation, is well known and a detailed description is unnecessary for a full understanding of the invention.

Figure 5:
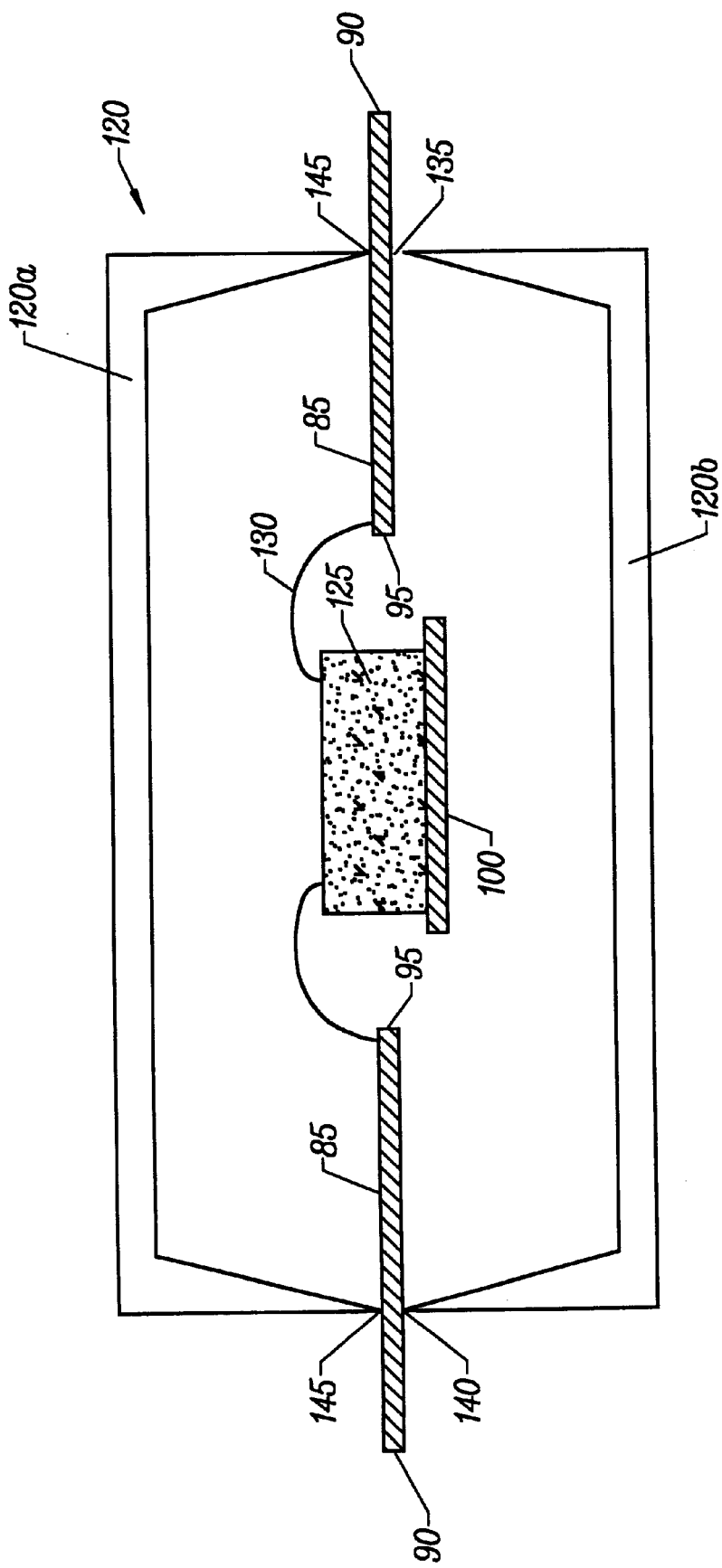
FIG. 5 is a graphical representation, in cross section, of a typical mold and leadframe assembly during a typical package molding process.

Following attachment of the IC to the leadframe and bonding of the IC and leads, the entire assembly is introduced into a mold, the shape and dimensions of the cavity of which define the package that will house the IC. FIG. 5 shows graphically a mold 120, having an upper mold half 120a and a lower mold half 120b. The mold 120 encapsulates the mounted IC 125, bonding wire 130 and inner portion 95 of the leads 85, which are typically about 0.005–0.020 inches in thickness. The edges 140, 145 of the mold define a clamping area or zone. In the case of a leadframe having a dambar, the edges 140, 145 of the mold extend out to the dambar, which as stated previously acts as a barrier to escape of the encapsulating epoxy. A liquid epoxy/silica mixture is introduced through an opening or "gate" 135 in the mold. The opening or "gate" can be either on the top half or bottom half (as illustrated) of the mold, hence the now familiar terms "top gating" or "bottom gating," both of which are well known in the art. The present invention is applicable to both. A number of suitable epoxy compounds and encapsulation processes are well known in the art and a detailed explanation thereof is unnecessary to a complete understanding of the present invention.

Figure 6:
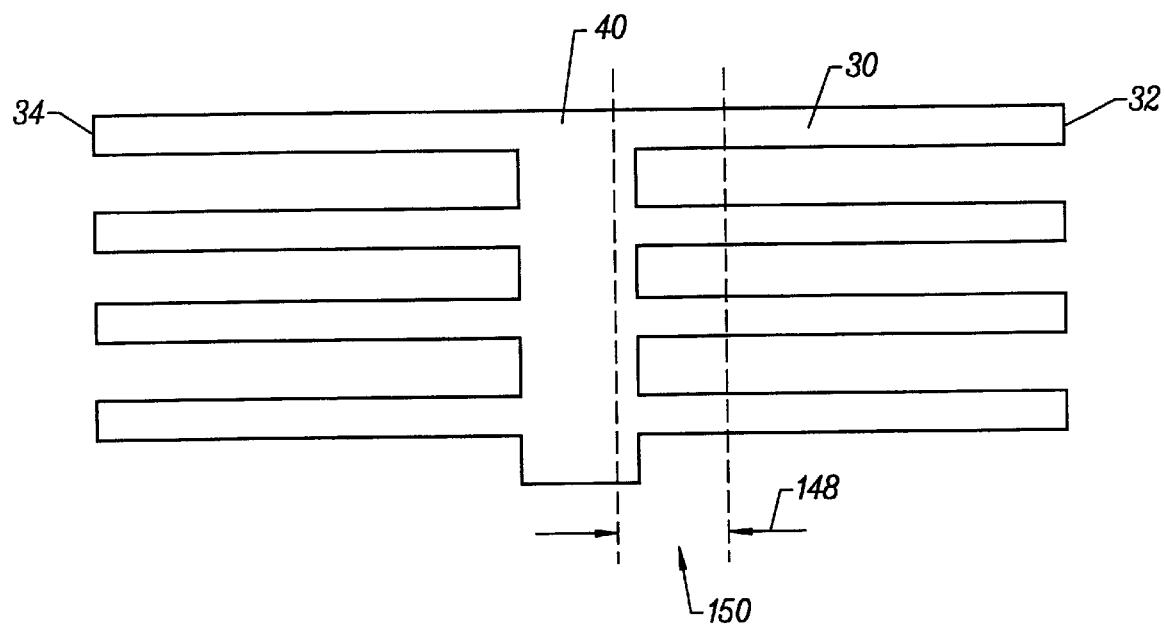
FIG. 6 is a plan view of a section of a known leadframe structure with an overlay showing the typical clampdown area of the mold relative to the dambar during a known package molding process.
Figure 6A:
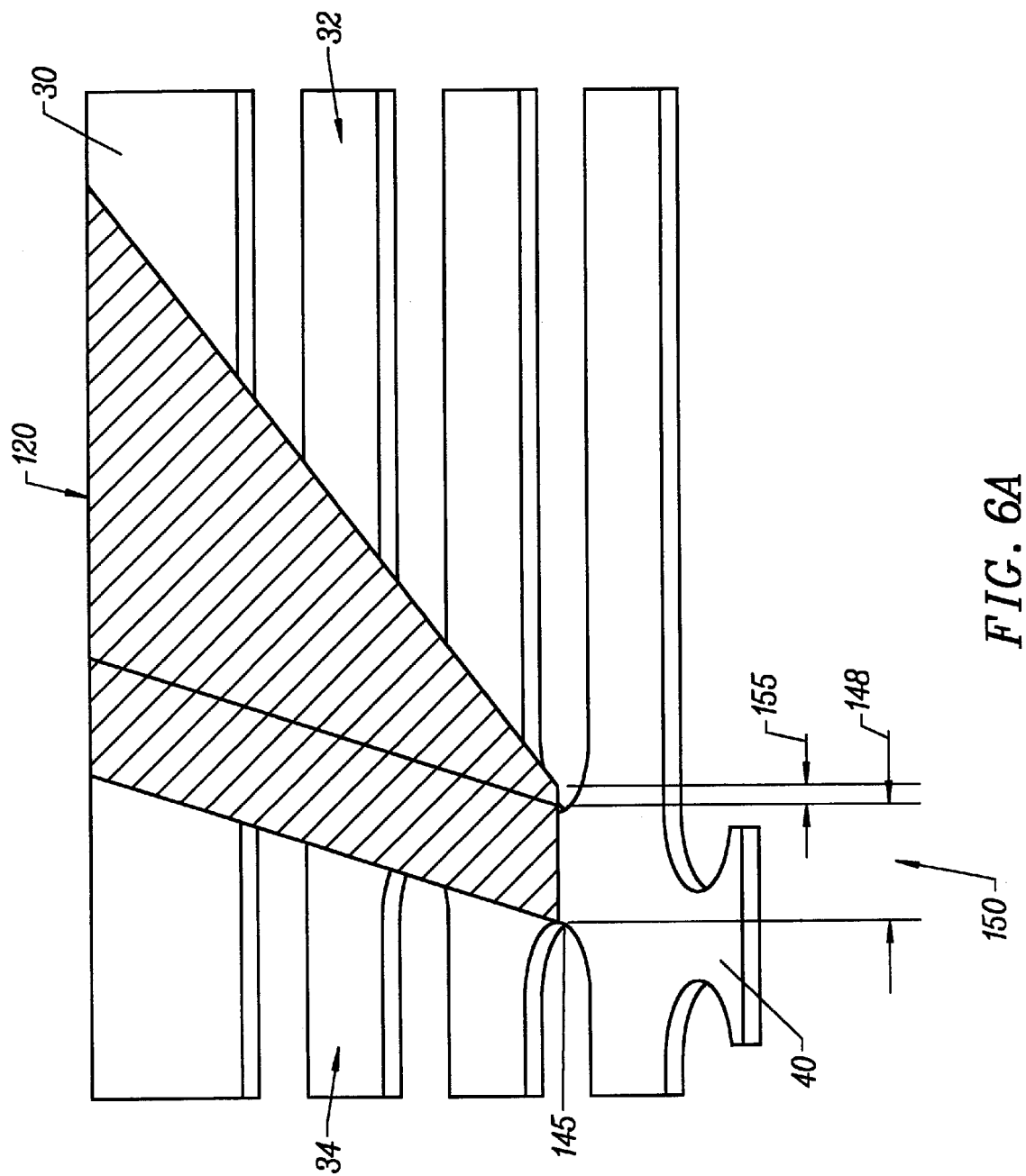
FIG. 6a is an elevated perspective view showing a section of a known leadframe structure and a section of the outside edge of one half of a mold during a known package molding process.

In a typical molding operation including a leadframe with a dambar, the outside edges 140, 145 of the two halves 120a, 120b of the mold are dimensioned and positioned to clamp down partially on the dambar. As shown in FIGS. 6 and 6a, the edges clamp down in a clamp zone 150, typically about 0.020–0.030 inches in width as shown by reference 148. The clamp zone 150 partially overlays the dambar 40 so that the dambar 40 functions as a barrier against leakage or streaming of the molten epoxy slurry between the leads 30. The mold edges 140, 145 overlap preferably by about 0.010±0.003 inches the inside portion 32 of the leads 30 as shown by reference 155. Because the epoxy is introduced into the mold under high pressure, typically in the range of 300 pounds per square inch (PSI), it is common to use a relatively high clamping force. For example, a clamping force of approximately 135,000 PSI or about four (4) tons per part is common for a typical 208 lead plastic quad flat package (PQFP). The dambar 40 forms a retainer and a metal gasket seal between the edges 140, 145 of the two mold halves 140, 145, when clamped down. However, for the reasons previously given, the dambar is not entirely successful in preventing the epoxy from streaming out between the leads and onto the planar surfaces of the outer leads 34.

Figure 7:
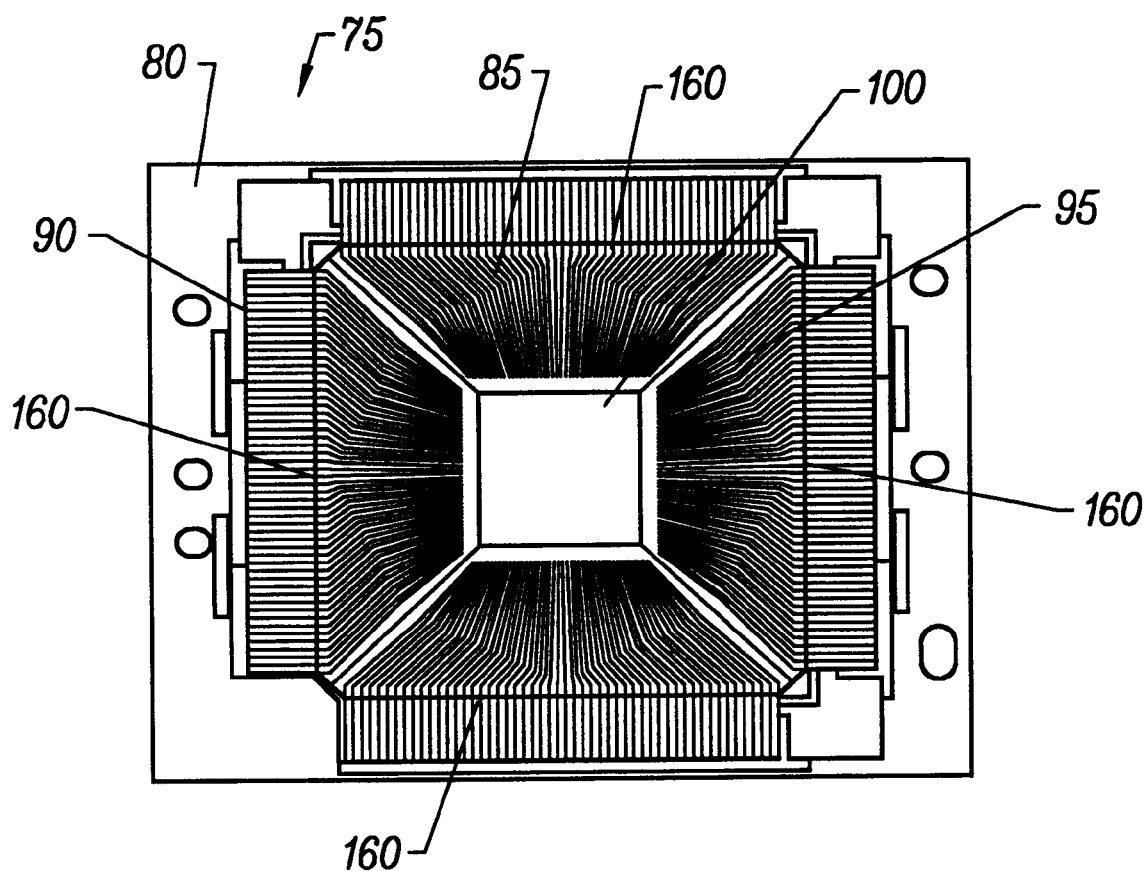
FIG. 7 is a plan view of a presently preferred embodiment of a dambarless leadframe with a polymeric structure located intermediate the inner and outer ends of the leads.
Figure 8:
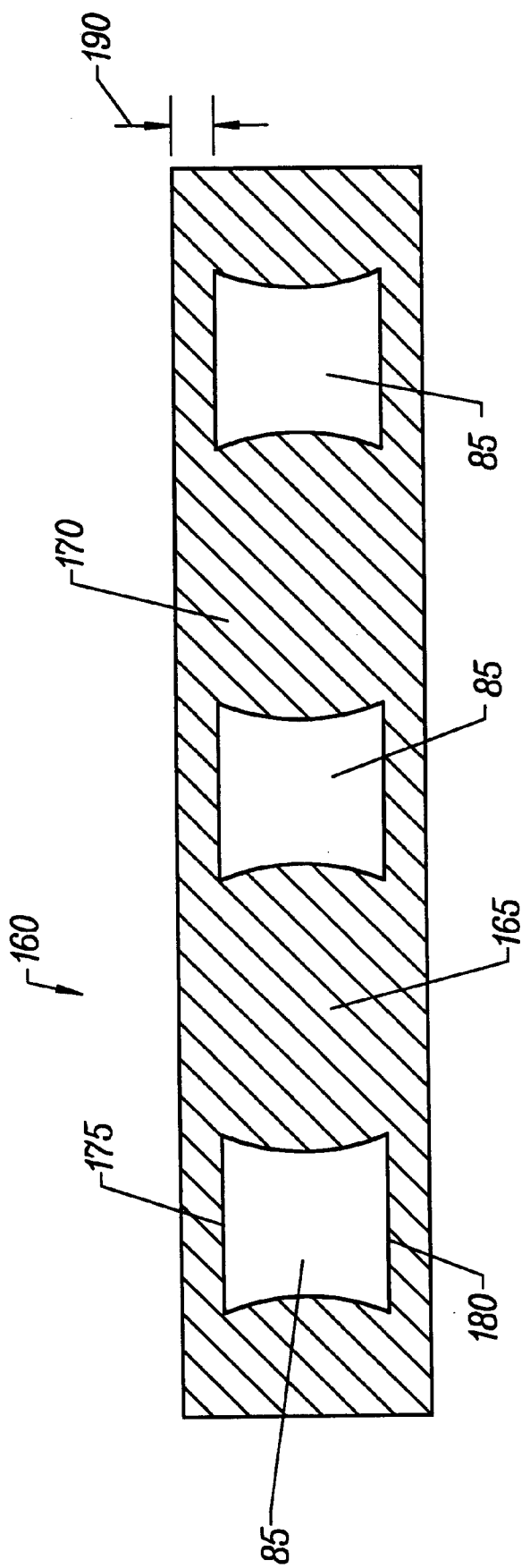
FIG. 8 is a cross sectional view of a section of FIG. 7 showing several leads encapsulated by the polymeric structure.
Figure 9A:
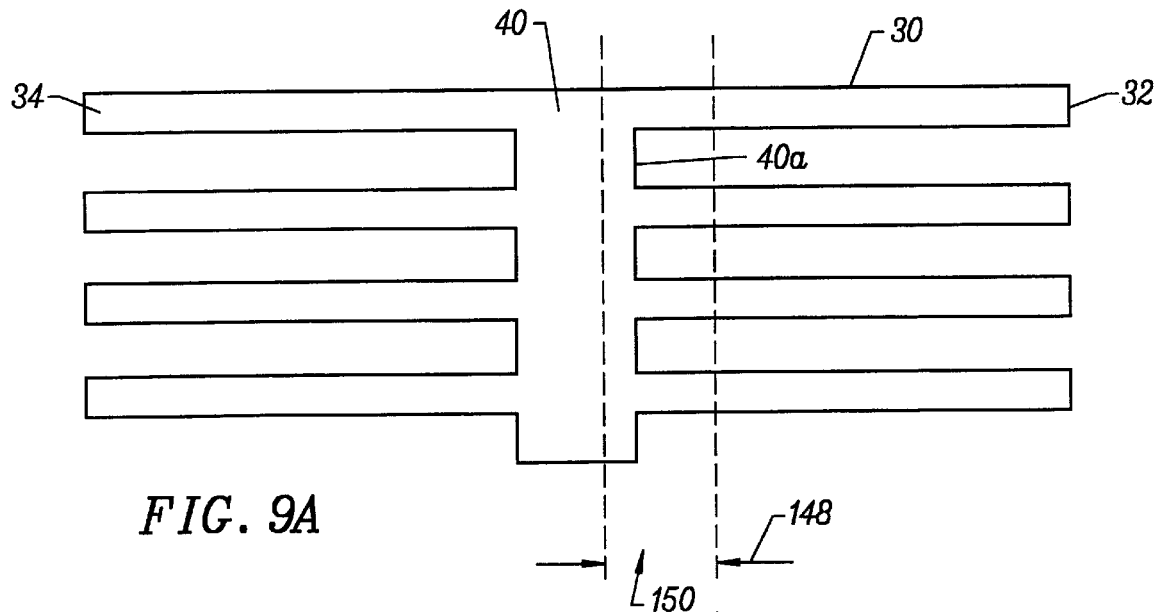
FIGS. 9a and 9b are graphical plan views of a section of a typical dambar-containing leadframe and a corresponding section of a preferred dambarless leadframe with a polymeric structure, illustrating the relative positioning with respect to a mold clampdown region.
Figure 9B:
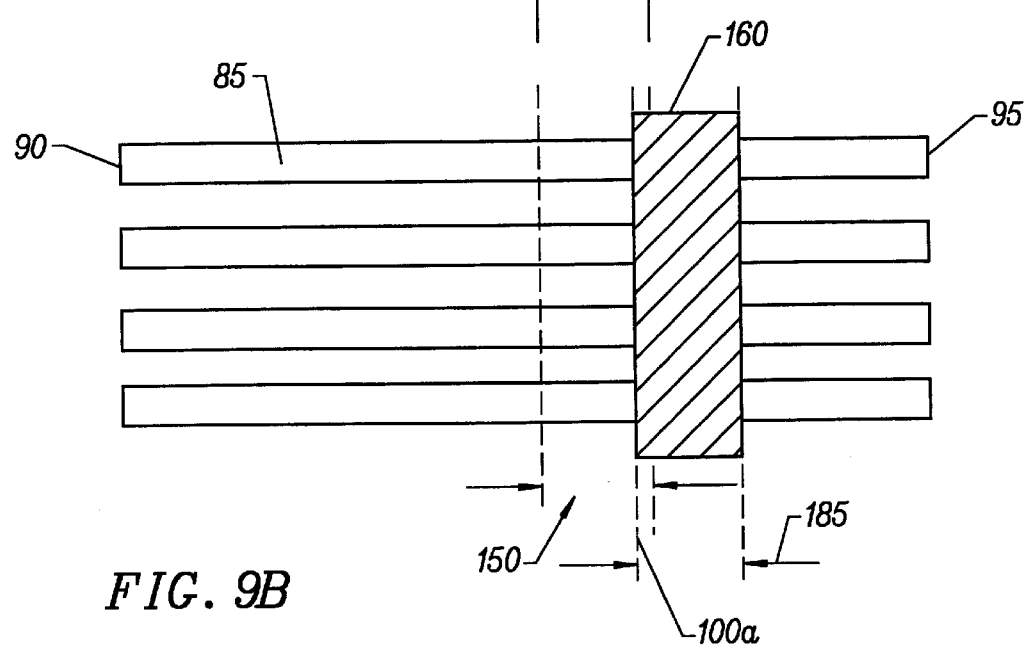

Referring now to FIGS. 7–9, a key feature of the present invention is the provision of a polymer structure 160. The primary function of the polymer structure 160 is to provide a barrier to prevent flashing during the epoxy encapsulation (molding) process. Secondarily, the polymer structure 160 also interconnects and supports the leads 85, maintains very precise and uniform lateral positioning and prevents twisting. Preferably the polymer structure 160 is formed and dimensioned such that it forms a "plug" 165 of material between each lead and a contiguous "ring" 170 of material which overlies and interconnects the plugs 165 and leads 85.

The ring 170 preferably extends in a generally, but not necessarily, transverse direction to the leads 85, covering the top 175 and bottom 180 surfaces thereof in the region of the structure. Preferably, the width dimension 185 of the structure, i.e., the dimension which extends inwardly along the length of the leads 85 towards the center of the package, is sufficient to provide good surface contact with the leads 85 and good resistance to pinhole or other breaches of the structure. The polymer structure thus preferably encapsulates the leads 85 in the region of the ring 170, forming a sort of contiguous composite structure. Together, the plugs 165 and ring 170 provide an excellent barrier against flashing, as well as lateral and torsional support for and spacing of the leads.

The shape and dimensions of the polymer structure 160 will generally be determined by the shape or outline of the preselected IC package. Typically, such packages are square or rectangular, although the invention is not so limited. While it is preferred that the polymer structure 160 close on itself, there may be leadframe configurations where it is desirable to combine the polymer structure with a partial dambar or other leadframe structure. For example, a partial dambar (not shown) could be formed at a corner of one or more quadrants of leads, for example to form a breathing hole for ejecting air from the mold cavity during the encapsulation process. In this instance, the polymer structure would not close on itself but would combine with the partial dambar structure. Alternatively, a partial dambar might be retained in certain leadframe configurations for additional lead support. While this approach is not necessarily the most preferred, it still essentially satisfies the objectives of the invention by reducing the adverse effects of the dambar and the dambar removal processes on the overall packaging process.

Preferably, as best shown in FIG. 7, the polymer structure 160 is located intermediate the outside ends 90 and the inner free ends 95 of the leads 85. As shown graphically in FIGS. 9a and 9b, it has been found effective to locate the polymer structure 160 generally in the vicinity where the dambar 40 would have been located, however, spaced slightly further inwardly toward the center of the package than the dambar would be. A reason for this is that in the case of the dambar structure, it is preferable for the edges of the mold to contact the dambar near its inner edge 40a so that most of the dambar 40 remains outside the package edge and is exposed to facilitate subsequent debarring. In contrast, it is generally preferred that the polymer structure 160 be positioned relative to the edges of the mold so that the mold edges contact the polymer structure 160 near its outside edge 160a. The polymer structure 160 thus extends only very slightly beyond the edge of the epoxy package when the encapsulation process is complete, which is desirable since the polymer structure 160 is preferably not thereafter removed, but preferably remains a permanent part of the IC package.

It has been found effective for the polymer structure 160 to have a width dimension 185, i.e., to extend generally in the lengthwise direction of the leads, approximately 0.010–0.020 inches or so, which is generally sufficient to fill the spaces between the leads, and to be built up on the planar surfaces, by about 0.001 to 0.010 inches or so as shown by reference 190.

Figure 10:
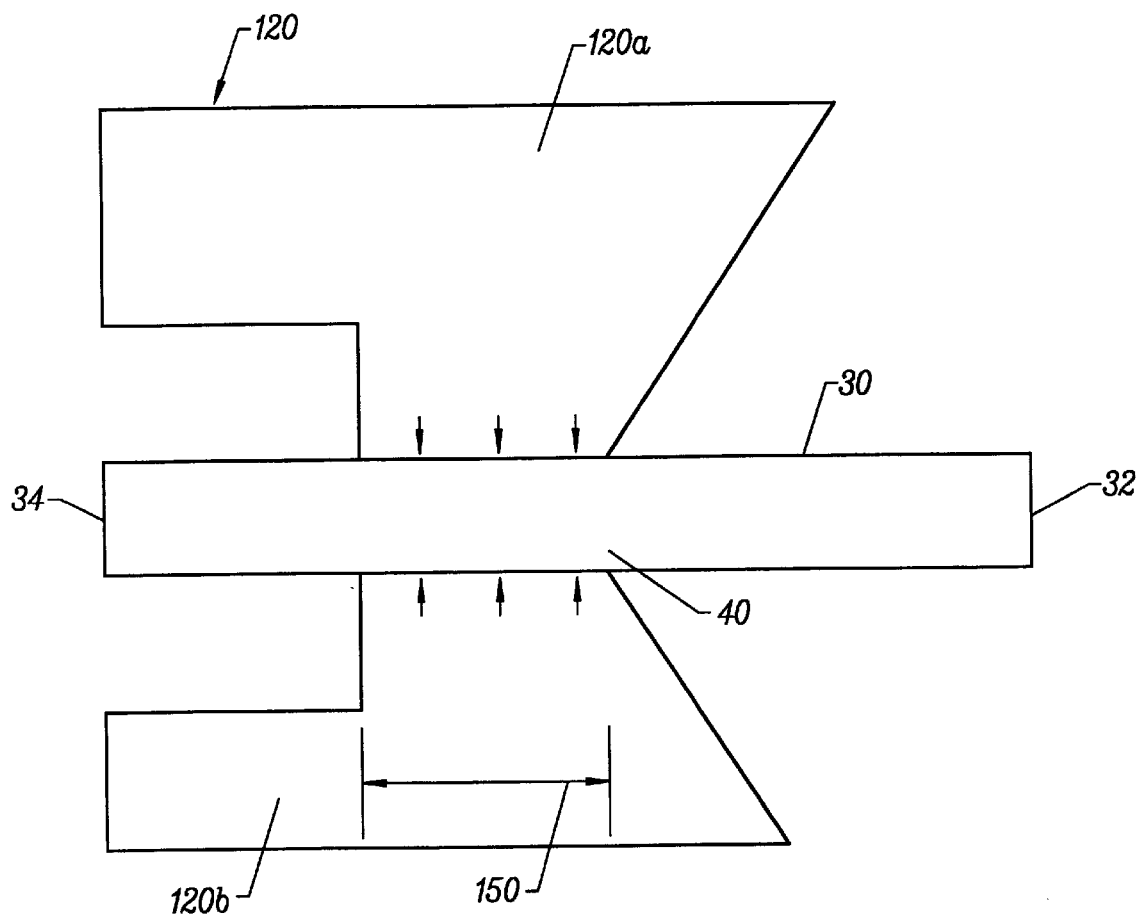
FIG. 10 is a graphical cross-sectional view illustrating mold clampdown on a typical dambar-containing leadframe.
Figure 11:
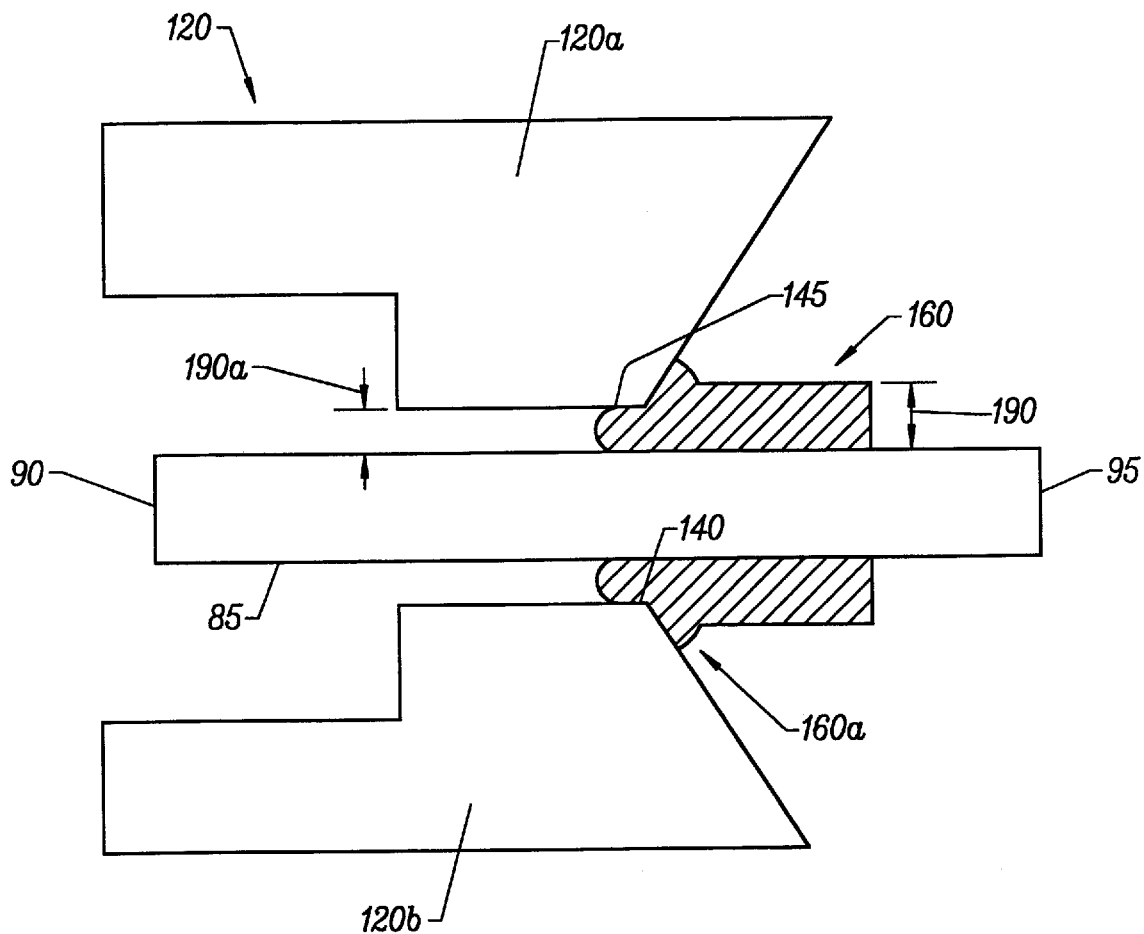
FIG. 11 is a graphical cross-sectional view illustrating mold clampdown on a presently preferred dambarless leadframe with a polymeric structure.
Figure 12:
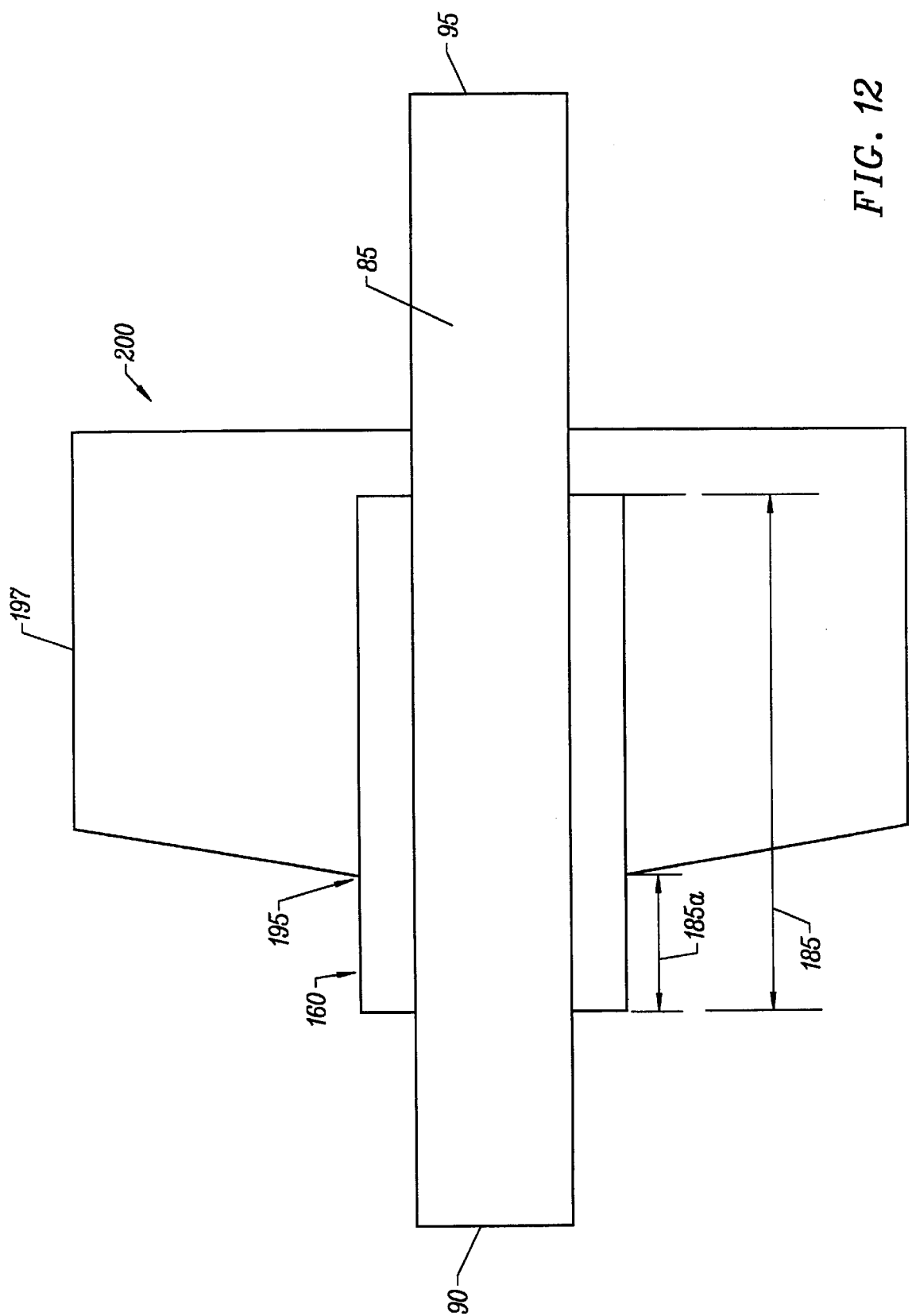
FIG. 12 is a graphical cross-sectional view illustrating a portion of the package of an IC after molding using a presently preferred embodiment of a dambarless leadframe with polymeric structure.
Figure 13:
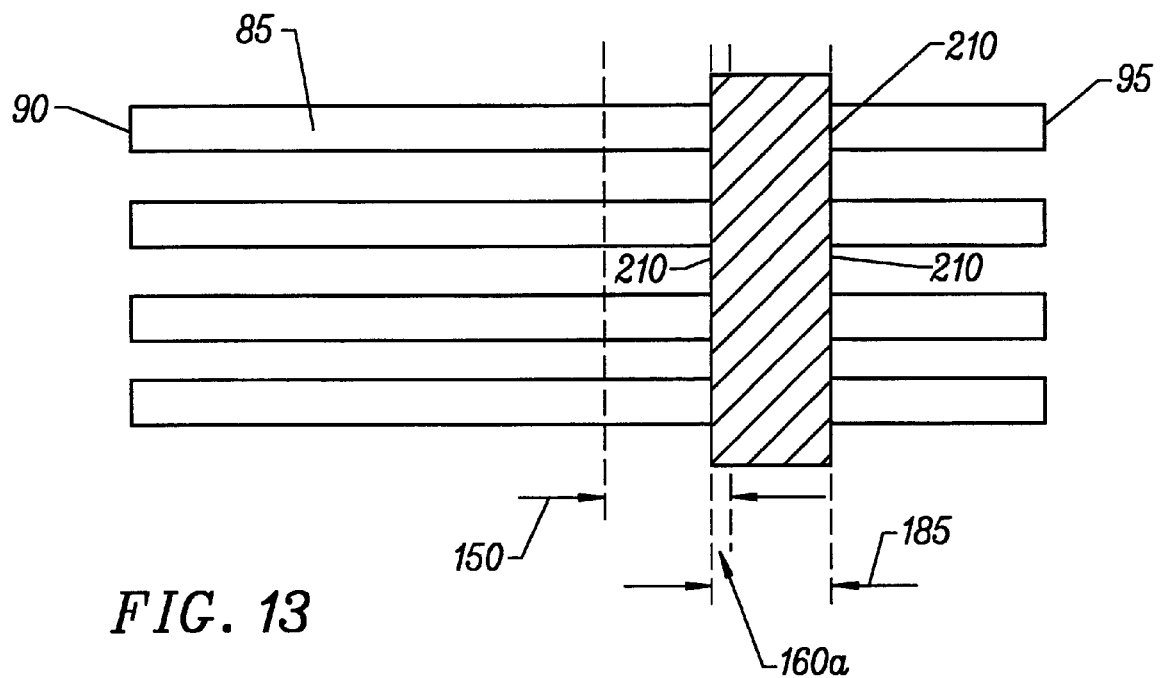
FIG. 13 is a graphical plan view of several leads of a presently preferred dambarless leadframe illustrating the polymeric structure and lead protrusions interlocking therewith.

Referring to FIGS. 10–12, it has been found effective to position the structure 160 so that the mold lips or edges 140, 145, which are typically approximately 0.0160 inch in width, clamp down on the outer 0.003–0.005 inch of the ring 170, as shown by reference 160a, with the balance of the ring being inside the mold cavity. This is in contrast to the situation with a dambar 40, where the mold edges clamp directly on the dambar surface, as shown in FIG. 10. As best shown in FIG. 12, the finished IC package 200 thus preferably incorporates the polymer structure 160 at least partially into the outer portion of the epoxy package 197, forming a substantially contiguous, airtight and liquid-tight structure which encapsulates the IC. The leads 85 pass through the structure. A portion 185a of the polymer structure 160 extends outside the package edge 195, preferably no more than about 0.005 inches or so, although both the extension and thickness of the structure may vary significantly depending on the needs of the particular process.

Many polymeric materials are suitable for use. The particular polymer system used, will preferably have physical, chemical and electrical properties that are compatible with the package molding compound (epoxy) used so that the incorporation of the polymeric material into the package perimeter will not degrade the package or circuit performance. For example, it is preferred to employ a polymeric material with dielectric constant similar to that of the epoxy to prevent potentially adverse electrical effects on the IC signals as they enter and exit the package. It is also preferred to employ a polymeric material with coefficients of thermal expansion and water absorption equal to or less than the epoxy to prevent dissimilar rates of expansion and contraction of the materials with temperature cycling of the IC, which could cause package failure. Further, it is preferable to employ a polymeric material with a glass temperature ($T_g$) equal to or higher than the molding and thermal curing temperatures to be used, to avoid viscous flow of the polymeric material during the encapsulation process.

A preferred system will be polymerizable by radiation such as x-rays or ultraviolet light. A system polymerizable by ultraviolet (UV) radiation will preferably polymerize at exposure speeds of less than 5 seconds, and preferably less than 2 seconds. Since some polymers become brittle upon full polymerization, it is desirable to polymerize the system by UV radiation to greater than about 70% but less than about 100% so that it retains some level of plasticity, which allows it to function as a sort of gasket between the mold halves during clampdown in the molding operation. As shown graphically in FIG. 11, it is preferable for the polymer structure to be at least partially deformable in the clamp zone during the encapsulation operation under the pressure applied by the mold edges 140, 145. In a presently preferred embodiment, the portion of the polymer structure 160 under pressure will deform to a dimension 190a, which is about 30–70% of the dimension 190 of the portion not under pressure, and most preferably about 50%. The final stage of polymerization or crosslinking of the structure will preferably be accomplished thermally during the molding process itself, which typically occurs at temperatures in excess of 170° C., and through the post mold cure, typically at a temperature of approximately 170° C. for as long as eight hours. The encapsulation (epoxy molding) processes themselves are well known in the art and a detailed description thereof is unnecessary for a complete understanding of the present invention.

Suitable polymeric materials possessing the preferred characteristics may include any of a number of commercially available polyamic acids, polyamic esters, polyamides, polyimides, acrylates, methacrylate compounds, cyanate esters and various radiation curable epoxies.

"The polymer structure 160 may be applied in the desired regions of the leadframe 75 via screen printing, a masking process, or directly with commercially available syringe micro-dispensers, which are well-known and available from numerous sources. The latter method is presently preferred for ease and accuracy of application and to reduce the number of process steps required. The width 185 of the ring 170 and the thickness of the material above the planar surfaces of the leads may be controlled by controlling the viscosity of the material and the radius of the syringes, as well as other relevant parameters of the material without requiring subsequent mechanical shaping or photolithographic patterning of the polymer." The particular viscosity employed will depend upon the leadframe configuration and parameters such as lead count and pitch. The control of the relevant parameters of the polymeric materials and of the dispensers is well within the ordinary level of skill in the art and further explanation is unnecessary to a complete understanding of the invention. Nevertheless, solely by way of example, a fine grade silicon dioxide, such as that manufactured and sold under the trade name Cabosil, might be added as a filler in proportions from 10–85% by volume to vary the viscosity of the polymeric material as desired.

In a presently preferred procedure, the polymer is first applied from one side (top or bottom) of the leadframe. It is then partially polymerized to a preselected level chosen to retain a degree of plasticity, by applying UV radiation for the desired time. For many suitable materials, an exposure time between less than about two seconds and five seconds will be sufficient. The leadframe is then "flipped" over and the application process is repeated thus ensuring adequate filling between the leads to form the "plug" 165 and sufficient build up on the plane surfaces of the leads to form the "ring" 170 to the desired height.

Formation of the polymer structure on the leadframe is preferably accomplished as a preliminary step in the packaging process before the IC is attached to the pad. Formation of the structure early in the process promotes the objective of maintaining lead positioning and stability throughout the process. When the alternative leadframe structure of FIG. 4 with a connection bar 105 for the tips of the inner leads is used in connection with the polymer structure, the connection bar 105 may be excised after the polymer structure has been put in place, and prior to encapsulation, for example during the pad downset operation, which is common to most leadframes used for the assembly of ICs in plastic packages. The outer frame of the leadframe will preferably be excised subsequent to encapsulation, for example during the trim and forum operation.

Because the molding compound (epoxy) is introduced through the gate into the mold cavity under fairly high pressure, approximately 300 PSI, there is a possibility under some conditions and with some choices of materials for the polymer structure to become partly or wholly dislodged from the leads, and partly or completely ejected from the mold, resulting in flashing. A further modification of the lead design of the leadframe in the region of the polymer structure can easily prevent this possibility. Referring to FIGS. 13 and 14a–c, the modification involves forming protrusions 210 along one or both sides of adjacent leads 85. The protrusions 210 act to form an interlocking composite structure with the polymer plug 165, which prevents the polymer material from becoming dislodged during the encapsulation process. The protrusions 210 can be formed in almost any conceivable shape selected by the user, consistent with the particular leadframe configuration and parameters, the needs of the assembly process as determined by the IC package being produced and the objective of forming an interlocking structure with the polymer. The protrusions may be formed on one or both sides of adjacent leads. As shown in the figures, for example, the protrusions may be square, rectangular, trapezoidal or even triangular in shape, may be facing each other to form a sort of "gate," or may be interdigitated. Preferably, the protrusions 210 will be formed in the region of the leads 85 within the package edge 195, i.e., within the outer edges 140, 145 of the mold.

Figure 14B:
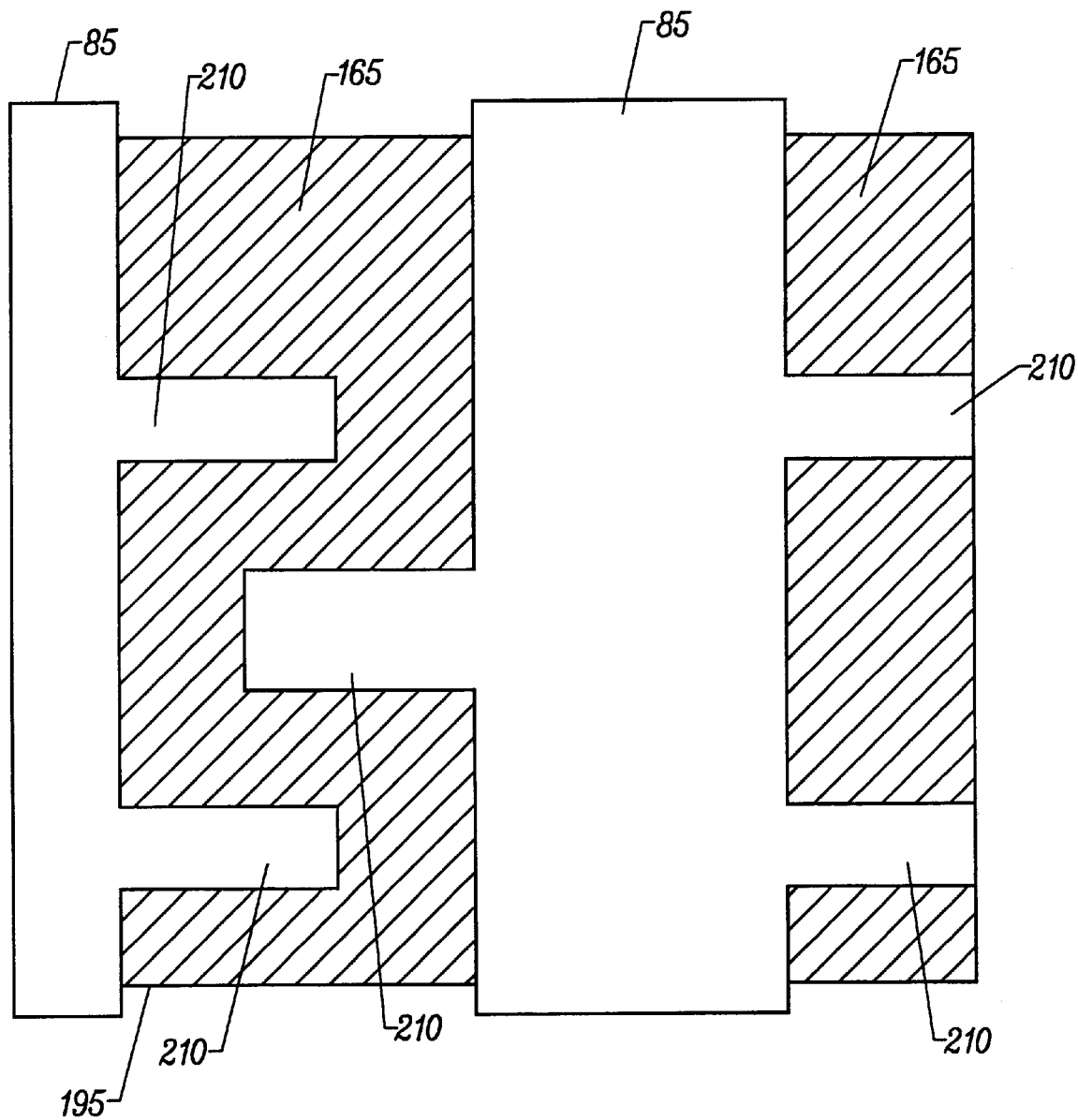
Figure 14C:
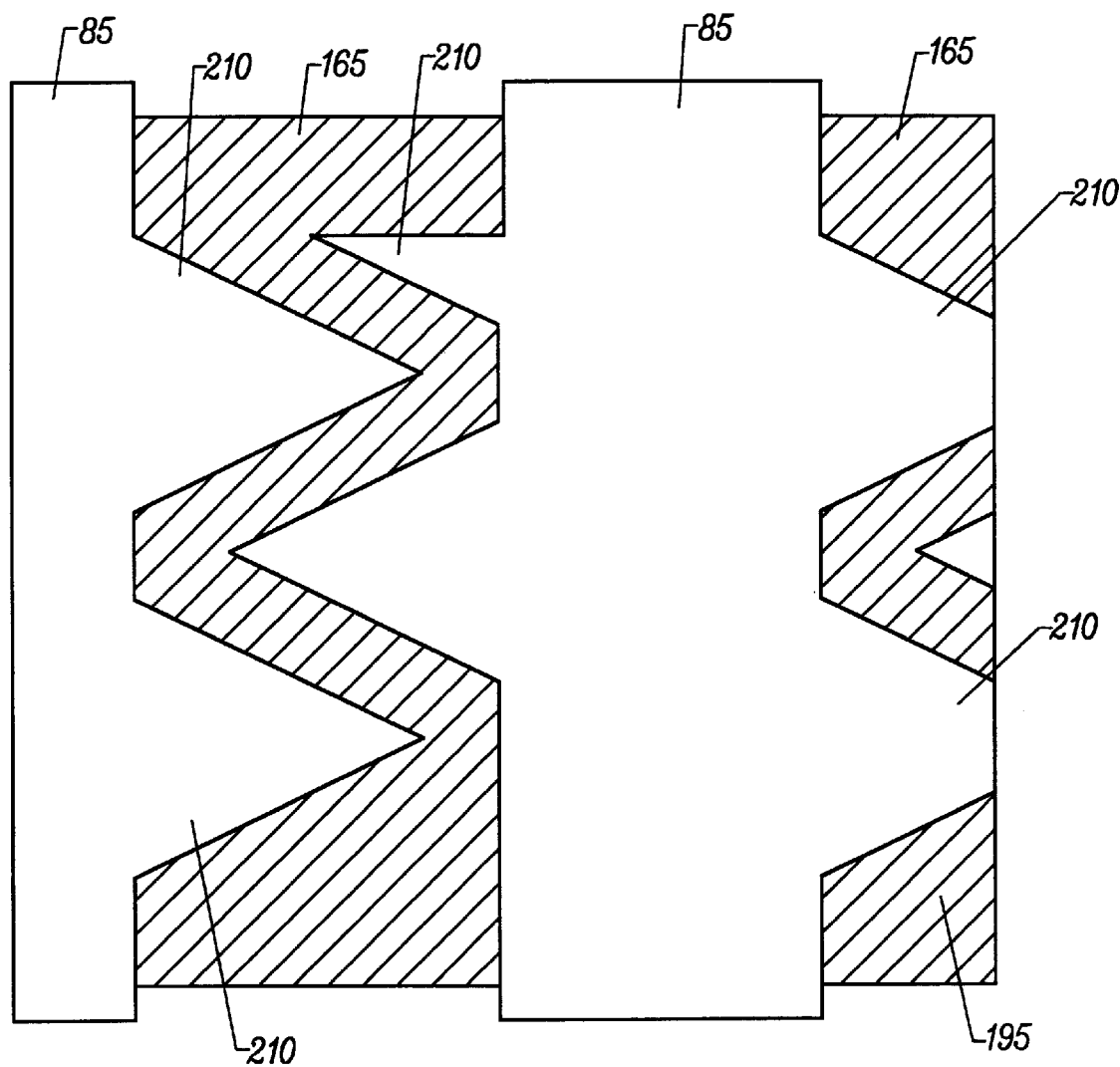
Figure 14D:
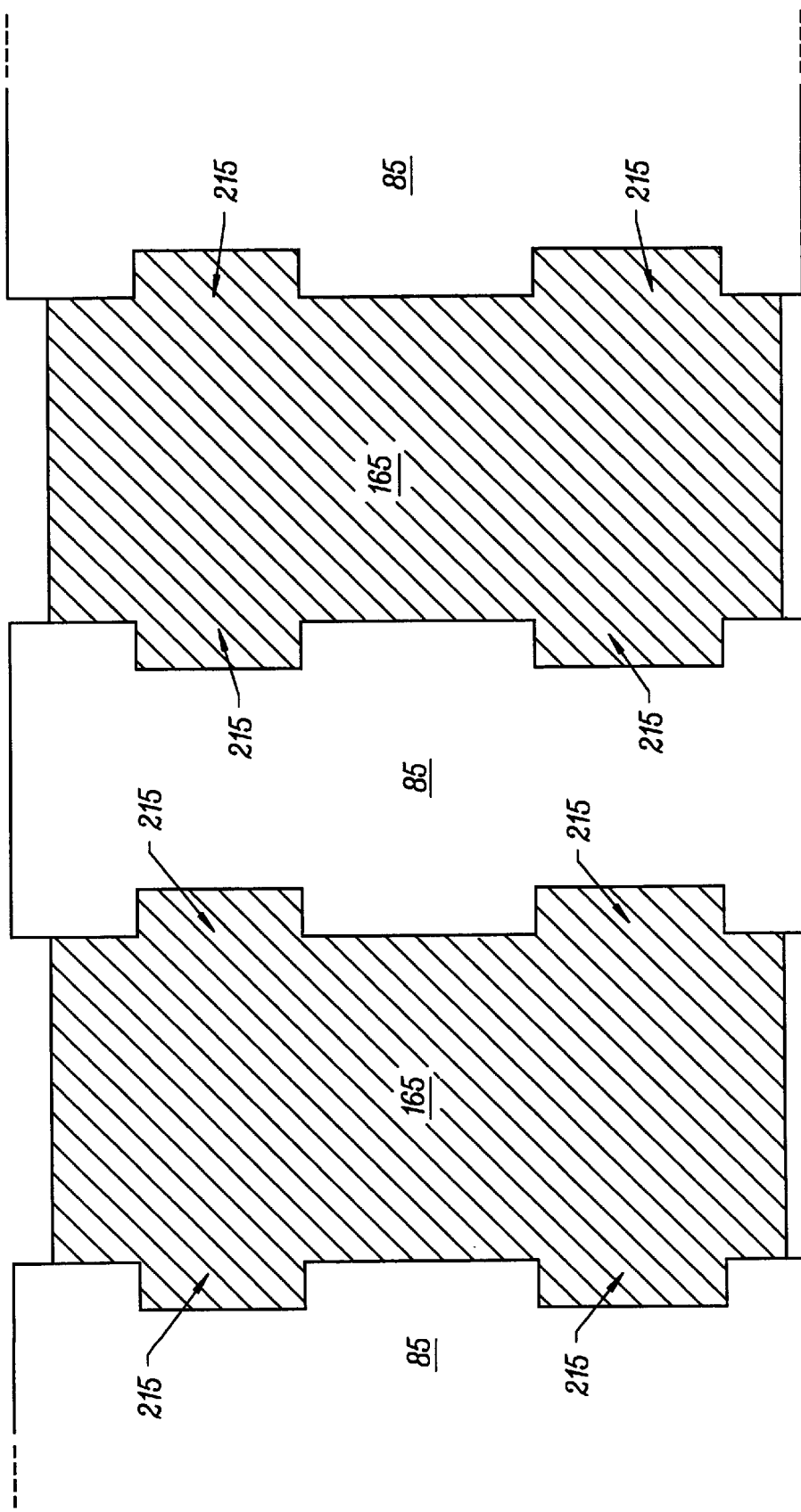

An alternative to forming protrusions is to stamp or etch small notches or recesses in the leads 85 as shown in FIG. 14d. When the polymer structure is formed, the polymer plug material 165 fills in the notches 215, forming a similar interlocking composite structure with the leads. As with the protrusions 210, the notches 215 may take almost any shape. This approach may have advantages in very dense, very small lead pitch leadframe designs where it may be difficult to provide significant protrusions without a risk of shorting the leads. A limiting factor on the use of notches, however, is that they should not significantly weaken the leads. The polymer plug 165 is beneficial in this regard in that it fills in the notches 215 and encapsulates the leads in the area of the notches, thereby providing additional protection and support.

The foregoing description of presently preferred embodiments of the invention is by way of example only and is not intended to be limiting of the scope of the invention. It will be apparent to persons skilled in the art that various changes in materials, designs, dimensions and the like, may be without departing from the spirit of the invention, the scope of which is intended to be defined solely by the following claims.

What is claimed is:

1. Method of manufacturing an improved leadframe structure for use in packaging an integrated circuit chip, comprising:

forming a leadframe structure including:
       a frame structure;
       a pad for mounting an exposed integrated circuit chip to be directly encapsulated; and
       a plurality of leads having inner ends and outer ends, said outer ends being located adjacent said frame structure and said inner ends being located adjacent said pad; and providing a substantially contiguous polymer structure extending and permanently substantially encasing between at least some of said leads intermediate said inner and outer ends in an area to be encapsulated with said pad, said polymer structure being formed by direct application to said leads without subsequent mechanical shaping or photolithographic patterning, including:
       introducing a first portion of polymer material along a preselected path on a first side of said leads, the volume and consistency of said first portion being sufficient to form a plug of polymer material between adjacent leads and a ring of polymer material atop and extending between said leads on said first side;
       at least partially curing said first portion of polymer material;
       introducing a second portion of polymer material along said preselected path on a second side of said leads, the volume and consistency of said second portion being sufficient to form a ring of polymer material atop and extending between said leads on said second side; and
       at least partially curing said second portion of polymer material;
       whereby said plug, said rings and said leads form a composite structure along said path.

2. An improved integrated circuit package, comprising:
   a leadframe including:
       a pad for mounting an exposed integrated circuit to be directly encapsulated;
       a plurality of leads having inner portions and outer ends, said inner ends being located adjacent said pad; and
       a substantially contiguous polymer structure extending between and permanently substantially encasing at least some of said leads intermediate said inner and outer ends in an area to be encapsulated with said pad, said polymer structure being formed by direct application to said leads without subsequent mechanical shaping or photolithographic patterning;
   an exposed integrated circuit chip mounted to said pad;
   a plurality of electrical conductors connected between said integrated circuit chip and said leadframe; and
   an epoxy structure directly encapsulating said integrated circuit chip, said pad, said electrical conductors and said inner ends of said leads, said outer ends of said leads extending outside said epoxy structure, said epoxy structure crosslinked with said polymer structure.

3. The integrated circuit package of claim 2 wherein at least some of said leads include protrusions adapted to interlock with said polymer structure.

4. The integrated circuit package of claim 2 wherein at least some of said leads include recesses adapted to interlock with said polymer structure.

5. The integrated circuit package of claim 3 or 4 wherein said protrusions and recesses are encapsulated within said epoxy structure.

6. The integrated circuit package of claim 2 wherein said polymer structure is a closed structure.

7. The integrated circuit package of claim 2 wherein said polymer structure includes a plug between adjacent leads and a ring overlying at least one of the planar surfaces of said leads.

8. The integrated circuit package of claim 2 wherein said polymer structure is annular and interconnects substantially all of the leads.

9. The integrated circuit package of claim 2 wherein said polymer structure comprises a material selected from a group comprising polyamic acids, polyamic esters, poly (amides-imides), acrylates, methacrylates and epoxies.

10. The integrated circuit package of claim 9 wherein said material is curable with radiation.

11. The integrated circuit package of claim 10 wherein said radiation is ultraviolet light.

12. The integrated circuit package of claim 2 wherein said epoxy structure has an outer edge, and wherein said epoxy structure and said polymer structure form a composite structure at said outer edge.

13. The integrated circuit package of claim 12 wherein said polymer structure has an outer edge, and wherein said outer edge of said polymer structure extends outwardly from said outer edge of said epoxy structure.

14. An improved method for packaging an integrated circuit chip, comprising:
   forming a leadframe having a frame structure, a pad for mounting an exposed integrated circuit chip to be directly encapsulated, and a plurality of leads having inner portions and outer ends, said inner ends being located adjacent said pad;
   forming a substantially contiguous and partially polymerized polymer structure extending between and permanently substantially encasing at least some of said leads intermediate said inner and outer ends in an area to be encapsulated with said pad;
   mounting an exposed integrated circuit chip to said pad;

connecting said integrated circuit chip and said leadframe with a plurality of electrical conductors;

directly encapsulating said integrated circuit chip, said pad, said electrical conductors and said inner ends of said leads within an epoxy structure, with said outer ends of said leads extending outside said epoxy structure;

completely curing said epoxy structure and said polymer structure so that said structures are crosslinked.

15. The method of claim 14 wherein forming a leadframe includes forming a frame structure with said outer ends of said leads being adjacent to said frame structure, and including the step of excising that frame structure subsequent to encapsulating said integrated circuit chip.

16. The method of claim 15 wherein said outer ends of said leads are connected to said frame structure.

17. The method of claim 14 wherein forming a leadframe includes interconnecting said inner ends of at least some of said leads, and including the step of excising the interconnection prior to connecting said integrated circuit and said leadframe.

18. The method of claim 14 wherein forming said leadframe structure includes forming protrusions in at least some of said leads adapted to interlock with said polymer structure.

19. The method of claim 14 wherein forming said leadframe structure includes forming recesses in at least some of said leads adapted to interlock with said polymer structure.

20. The method of claim 14 wherein said polymer structure is a closed structure.

21. The method of claim 14 wherein said polymer structure includes a plug between adjacent leads and a ring overlying at least one of the planar surfaces of said leads.

22. The method of claim 14 wherein said polymer structure is annular and interconnects substantially all of the leads.

23. The method of claim 14 wherein said polymer structure comprises a material selected from a group comprising polyamic acids, polyamic esters, poly (amides-imides), acrylates, methacrylates and epoxies.

24. The method of claim 23 wherein said material is curable with radiation.

25. The method of claim 24 wherein said radiation is ultraviolet light.

26. The method of claim 14 wherein forming said polymer structure includes the steps of:

introducing polymer material between adjacent leads to form a plug of material between said leads; and introducing polymer material atop at least one of the planar surfaces of said leads to form a ring of material extending atop and between said leads.

27. The method of claim 14 wherein forming said polymer structure includes the steps of:

introducing a first portion of polymer material along a preselected path on a first side of said leads, the volume and consistency of said first portion being sufficient to form a plug of polymer material between adjacent leads and a ring of polymer material atop and extending between said leads on said first side;

partially curing said first portion of polymer material;

introducing a second portion of polymer material along said preselected path on a second side of said leads, the volume and consistency of said second portion being sufficient to form a ring of polymer material atop and extending between said leads on said second side; and partially curing said second portion of polymer material;

whereby said plug, said rings and said leads form a composite structure along said path.

28. The method of claim 14 wherein encapsulating the integrated circuit within an epoxy structure includes the steps of:

providing a mold having a cavity with a predetermined package shape and volume, said mold having an outside edge defining a clamping area;

introducing said integrated circuit chip mounted on said leadframe into said mold with said inner ends of said leads within the mold cavity and said outer ends of said leads extending out of the mold cavity;

aligning said mold edge and said polymer structure so that said clamping area overlays at least a portion of said polymer structure;

clamping said mold edge on said polymer structure such that a seal is formed between said mold edge and said polymer structure in the clamping area;

introducing an epoxy material into said mold; and curing said epoxy material.

29. The method of claim 28 wherein said mold edge is aligned with an outer portion of said polymer structure such that a substantial portion of the polymer structure is encapsulated within the epoxy package.

30. The method of claim 28 wherein said mold edge is clamped on said polymer structure with sufficient force to partially deform said polymer structure in the clamping area.

31. The method of claim 30 wherein said force is sufficient to deform the polymer structure in the clamping area to about 30–70% of its original dimension.

* * * * *